United States Patent
Iizuka et al.

(10) Patent No.: US 8,760,628 B2
(45) Date of Patent: Jun. 24, 2014

(54) FILTER, EXPOSURE APPARATUS, AND METHOD OF MANUFACTURING DEVICE

(75) Inventors: Naoya Iizuka, Utsunomiya (JP); Fumitaro Masaki, Utsunomiya (JP); Akira Miyake, Nasukarasuyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 36 days.

(21) Appl. No.: 13/330,776

(22) Filed: Dec. 20, 2011

(65) Prior Publication Data

US 2012/0171622 A1 Jul. 5, 2012

(30) Foreign Application Priority Data

Jan. 1, 2011 (JP) ................... 2011-000006

(51) Int. Cl.
*G03B 7/26* (2006.01)
*G03B 27/54* (2006.01)

(52) U.S. Cl.
USPC ............................................ 355/71; 430/311

(58) Field of Classification Search
USPC ................. 355/71; 359/634; 430/311
See application file for complete search history.

(56) References Cited

U.S. PATENT DOCUMENTS

| | | | | |
|---|---|---|---|---|
| 2005/0236585 A1* | 10/2005 | Miyake | ........................ | 250/492.2 |
| 2006/0146413 A1* | 7/2006 | Klunder et al. | ................ | 359/634 |
| 2009/0314967 A1 | 12/2009 | Moriya et al. | | |
| 2010/0085549 A1 | 4/2010 | Sumitomo et al. | | |
| 2010/0140512 A1 | 6/2010 | Suganuma et al. | | |

FOREIGN PATENT DOCUMENTS

| | | |
|---|---|---|
| JP | 61-267016 A | 11/1986 |
| JP | 2004-109928 A | 4/2004 |
| JP | 2006-107933 A | 4/2006 |
| JP | 2006191090 A | 7/2006 |
| JP | 2010-21543 A | 1/2010 |
| JP | 2010-87388 A | 4/2010 |
| JP | 2010-123942 A | 6/2010 |
| WO | 2009/061192 A1 | 5/2009 |

OTHER PUBLICATIONS

Soer, et al., "Grid Spectral Purity Filters for Suppression of Infrared Radiation in Laser-Produced Plasma EUV Sources", Alternative Lithographic Technologies, SPIE vol. 7271, 7271Y, 2009.

Office Action issued in corresponding Japanese Patent Application No. 2011-000006 dated Nov. 19, 2012.

* cited by examiner

*Primary Examiner* — Caleen Sullivan (74) *Attorney, Agent, or Firm* — Rossi, Kimms & McDowell, LLP (57) ABSTRACT

A filter reflects first light having a first wavelength, and transmits second light having a second wavelength shorter than the first wavelength. The filter includes a plurality of plate members positioned parallel to each other with gaps therebetween in a first direction. An enveloping surface formed by end surfaces of the plurality of plate members forms a flat surface, which is nonparallel to the first direction. The filter transmits the second light to the second direction.

14 Claims, 6 Drawing Sheets

FILTER, EXPOSURE APPARATUS, AND METHOD OF MANUFACTURING DEVICE

BACKGROUND OF THE INVENTION

1. Field of the Invention

The present invention relates to a filter, an exposure apparatus, and a method of manufacturing a device.

2. Description of the Related Art

A plasma light source such as a laser-produced plasma light source (LPP) or a discharge-produced plasma light source (DPP) is used as an EUV (Extreme Ultra-Violet) light source. The LPP, for example, irradiates a target material placed in a vacuum chamber with high-intensity pulsed laser light to generate a high-temperature plasma so as to use EUV light which has a wavelength of, for example, about 13.5 nm and is emitted by the target material. A metal or an inert gas, for example, is used as the target material. To increase the average intensity of the EUV light emitted by the target, the pulsed laser can have as high a repetition frequency as possible, and is therefore normally operated at a repetition frequency of several kilohertz. Also, a condensing mirror is provided to efficiently use the EUV light emitted by the target. A multilayer mirror formed by alternately stacking 60 sets of molybdenum and silicon films on a mirror substrate, or an oblique-incidence mirror formed by coating a metal on a mirror substrate, for example, is used as the condensing mirror. An illumination optical system is formed by, for example, pluralities of multilayer mirrors, oblique-incidence mirrors, and reflective integrators. The reflective integrator serves to uniformly illuminate a mask at a predetermined numerical aperture. The reflective integrator receives collimated EUV light to form a secondary light source at a position defined by its focal length f.

EUV light supplied from an illumination system is reflected by a reticle serving as an original, is reduced to ¼ by a projection optical system formed by six to eight multilayer mirrors, and is guided to a wafer coated with a resist. The reticle and the wafer are held by a reticle stage and a wafer stage, respectively, and are synchronously scanned at a speed ratio proportional to the reduction magnification while being precisely aligned by an alignment optical system and precisely focused by a focus detecting optical system. In this way, an operation of synchronously scanning the reticle and the wafer while a reduction projection image of the reticle is formed on the wafer (step-and-scan) is repeated. The transfer pattern of the reticle is thus transferred onto the entire surface of the wafer.

A plasma light source emits not only desired EUV light but also OoB (Out of Band) light beams in the infrared to EUV range. These OoB light beams become a flare, which reduces the contrast of the light on the wafer and thermally expands the wafer. Also, these OoB light beams increase the heat load of a mirror, thus posing a serious problem especially in a mirror of a projection system.

Japanese Patent Laid-Open No. 2006-191090 and Wouter A. Soer, "Grid Spectral purity filters for suppression of infrared radiation in laser-produced plasma EUV sources", Proc. of SPIE Vol. 72712Y-8 (2009), disclose methods of placing a spectral purity filter in the optical path to selectively transmit only desired EUV light so as to eliminate OoB light. In the technique described by Wouter A. Soer, the filter is provided with an opening having a size smaller than the wavelength of OoB light to transmit only EUV light and reflect OoB light (infrared light).

However, because the conventional filter reflects OoB light (infrared light) toward a mirror on the upstream side, the reflected light heats members such as a mirror and a chamber. Also, because the OoB light passes through an optical path that does not conform to a design optical path, infrared light that becomes stray light not only passes through the illumination system but also reaches even an optical element of the projection optical system and the surface of the wafer, thus heating these members.

SUMMARY OF THE INVENTION

In view of this, the present invention provides a filter which selectively transmits light having a specific wavelength without producing an adverse effect due to factors associated with light reflected by the filter.

The present invention in its one aspect provides a filter which reflects first light having a first wavelength, and transmits second light having a second wavelength shorter than the first wavelength, the filter comprising a plurality of plate members positioned parallel to each other with gaps therebetween in a first direction, and extend in a second direction perpendicular to the first direction, wherein an enveloping surface formed by end surfaces of the plurality of plate members forms a flat surface, which is nonparallel to the first direction, and the filter transmits the second light to the second direction.

Further features of the present invention will become apparent from the following description of exemplary embodiments with reference to the attached drawings.

DESCRIPTION OF THE EMBODIMENTS

An exposure apparatus according to the present invention includes a light source which emits light containing first light having a first wavelength, and second light having a second wavelength shorter than the first wavelength, and a filter which reflects the first light of the light received from the light source, and transmits the second light of this received light. The exposure apparatus also includes an absorbing member which is positioned outside the optical path of the light emitted by the light source, and absorbs the first light. The first light reflected by the filter travels toward the absorbing member. The exposure apparatus exposes a substrate to the second light transmitted through the filter. The first light is, for example, infrared light, and the second light is, for example, EUV light. The infrared light incident on the filter is reflected in a direction different from that in which it is incident on the filter, thereby preventing it from becoming return light. The filter is configured so as to minimize the loss of EUV light when the EUV light incident on the filter is eclipsed by the inner wall of the filter.

When the filter is formed by aligning, for example, a plurality of plate members having a thickness sufficiently smaller than the wavelength of infrared light parallel to each other with gaps between them, which is sufficiently smaller than the wavelength of infrared light and is larger than the wavelength of EUV light, it can reflect incident infrared light and transmit incident EUV light. At this time, among polarized components of the incident infrared light, a polarized component having an electrical vector parallel to the plate members is reflected, and that having an electrical vector perpendicular to the plate members is transmitted. Accordingly, in the exposure apparatus, if incident infrared light is linearly or approximately linearly polarized, one filter is positioned so that the electrical vector of the infrared light is parallel to the plate members. If incident infrared light is randomly or approximately randomly polarized, two filters formed by the plate members are used. By positioning the two filters in the same optical path so that their plate members are orthogonal to each other, polarized components of the incident infrared light in all directions can be reflected.

The filter has a shape formed by juxtaposing a plurality of plate members or cylindrical members having openings so that the end surfaces form a predetermined surface. The inner wall of the filter is positioned parallel to incident light, and a normal to the predetermined surface is nonparallel to the incident light. If the filter is formed by a plurality of plate members positioned in a first direction perpendicular to the light incident direction (second direction), an enveloping surface formed by the end surfaces of the plate members forms a flat surface nonparallel to the first direction or a curved surface having a center of curvature which falls outside the optical path. If the filter is formed by a member which has a plurality of openings and is positioned in the first direction, the end surface of the member forms a flat surface nonparallel to the first direction or a curved surface having a center of curvature which falls outside the optical path as well. Infrared light reflected by the filter placed in the exposure apparatus heats constituent members of the exposure apparatus, such as a chamber and a holding portion. By placing an absorbing member which absorbs the reflected infrared light, the infrared light can be prevented from heating the constituent members of the exposure apparatus. The absorbing member is placed outside the optical path of exposure light. The placement angle of the filter is determined so that the reflected infrared light travels toward the absorbing member.

The exposure apparatus may have a small size. To do this, each element in the apparatus need only be compact. This improves the freedom of positioning of these elements to make it easy to design the apparatus. To downsize the absorbing member, infrared light reflected by the filter must be converged. By imparting a given curvature to the surface of the filter, infrared light reflected by the filter can be converged and guided to the absorbing member. Light incident on the filter placed in the exposure apparatus is not always collimated light. When light incident on the filter is convergent light or divergent light, the angle at which the light is incident on the filter is not equal within the plane of the filter. When all the inner walls which form the filter are parallel to each other, and the filter is placed so that the inner wall is parallel to incident light at a certain position, EUV light is eclipsed at positions other than the certain position, thus decreasing the transmittance of the EUV light. Hence, by setting the angle of each inner wall of the filter so that this inner wall is parallel to incident light at the position of this inner wall, a decrease in transmittance of the EUV light can be prevented. Embodiments of the present invention will be described in detail below with reference to the accompanying drawings.

First Embodiment

Figure 1A:
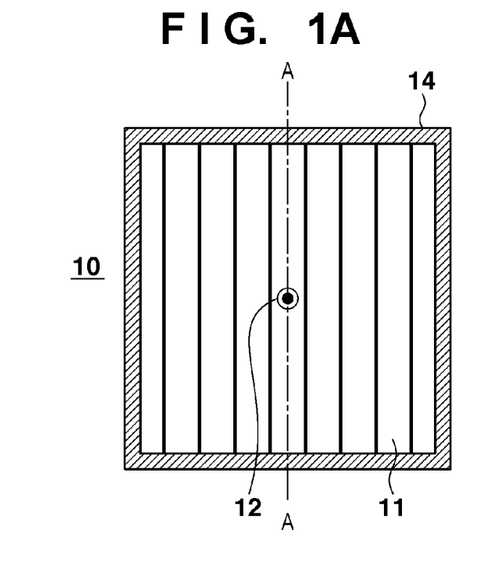
FIGS. 1A and 1B are a front view and sectional view, respectively, of a filter according to the first embodiment.
Figure 1B:
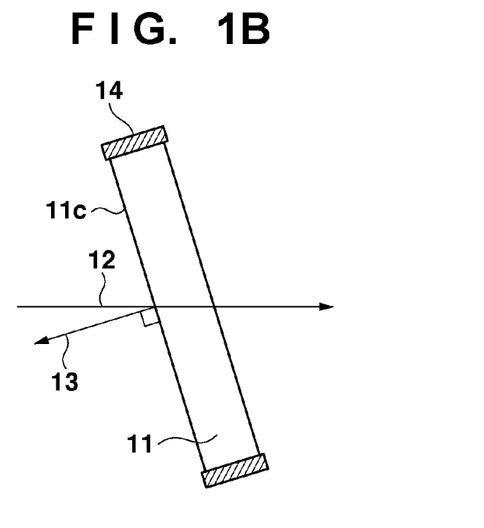
Figure 3:
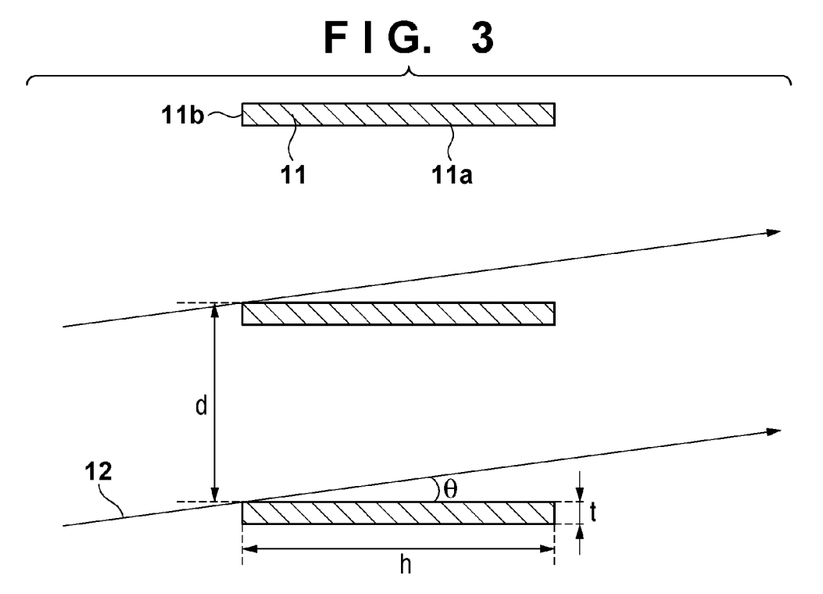
FIG. 3 is a view showing the filter according to the first embodiment.

A filter 10 according to the first embodiment will be described with reference to FIGS. 1A, 1B, and 3. The filter 10 has a structure in which a plurality of plate members 11 are aligned parallel to each other with predetermined gaps between them, which is smaller than the wavelength of infrared light and is larger than the wavelength of EUV light, so slit-shaped openings align themselves when viewed from the front side, as shown in FIG. 1A. The filter 10 is positioned so that inner walls 11a (FIG. 3) of the plate members 11 are parallel to incident light 12, and a normal 13 to an enveloping surface 11c formed by end surfaces 11b (FIG. 3) of the plate members 11 on the side on which the incident light 12 is incident on the filter 10 is nonparallel to the direction (second direction) in which the incident light 12 travels. In other words, the filter 10 is placed so that the enveloping surface 11c is tilted with respect to a plane perpendicular to the direction in which the incident light 12 travels, as shown in FIG. 1B. The plurality of plate members 11 are held by a holder 14.

Figure 2:
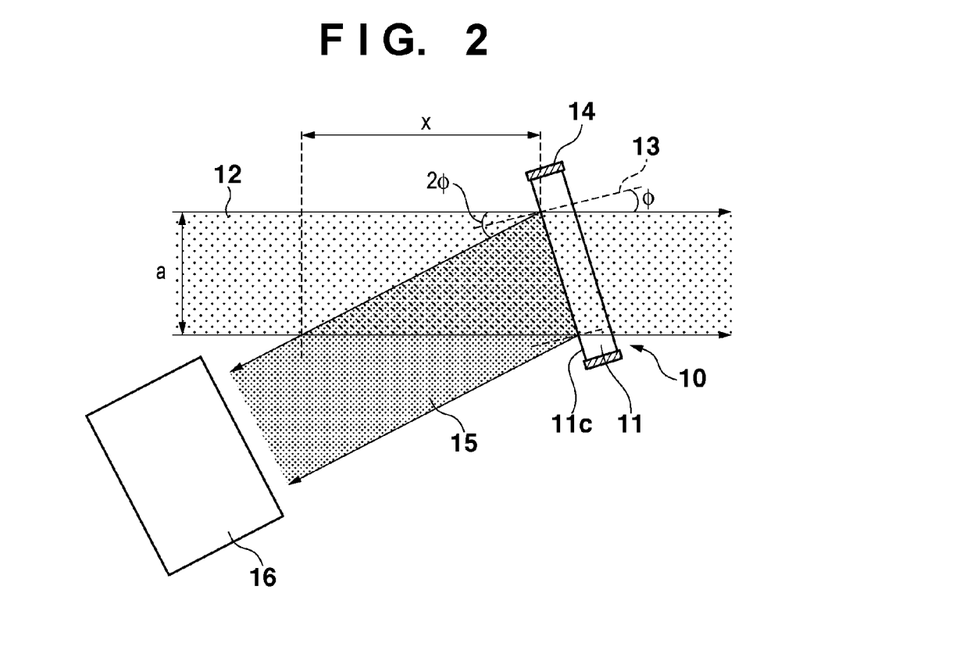
FIG. 2 is a view showing the state in which the filter according to the first embodiment reflects infrared light.

FIG. 2 schematically shows the relationship between the incident light 12 and the filter 10 when the filter 10 is mounted in an EUV exposure apparatus. The filter 10 is inserted at the position in the optical path of an illumination system, at which exposure light is collimated. Referring to FIG. 2, the left side is the upstream side of the illumination system, and the right side is its downstream side. Reference numeral 12 denotes incident light. Infrared light and EUV light mix with each other on the upstream side of the filter 10. The filter 10 reflects the infrared light, and guides (transmits) the EUV light to an optical system on the downstream side. To prevent reflected infrared light 15 from becoming stray light and heating the exposure apparatus, an absorbing member 16 for absorbing the reflected infrared light 15 is placed outside the optical path of the exposure light. Note that the angle of the normal 13 to the enveloping surface 11c of the filter 10 on the incident side is set so as to bisect an angle determined by a vector formed by the incident light 12 and that which connects the incident point and the absorbing member 16 to each other. The inner walls 11a of the filter 10 are parallel to the incident light 12. Loss of exposure light upon insertion of the filter 10 is generated only when the EUV light strikes a portion defined by the end surfaces 11b of the plate members 11 shown in the front view of FIG. 1. Since the EUV light is not eclipsed by the wall surfaces of the plate members 11, the loss of EUV light can be minimized.

Because the filter 10 used in this embodiment is formed by aligning the plate members 11, it can reflect only a polarized component parallel to the plate members 11. Accordingly, when infrared light incident on the filter 10 is randomly polarized, another filter 10' similar to the filter 10 is used. The second filter 10' is placed in the same optical path as in the first filter 10 so that the slit longitudinal direction of the former is perpendicular to that of the latter. To reflect incident infrared light in a direction different from that in which the incident light 12 travels, the second filter 10' is placed so that an enveloping surface formed by the end surfaces is tilted with respect to a plane perpendicular to the direction in which the incident light travels, like the first filter 10.

The size of the overall filter 10 is set to, for example, about 30 mm×30 mm so as to be equal to or larger than the beam size at the position in the exposure apparatus, at which the filter 10 is placed. The filter 10 is placed at the position in the optical path of the illumination system, at which exposure light is collimated. At this time, the filter 10 is also placed so that the inner walls 11a of the filter 10 are parallel to light incident on the filter 10. As shown in FIG. 3, the loss of EUV light due to factors associated with an angle θ that the incident light 12 and the wall surfaces of the plate members 11 make with each other is given, from the projection area of the plate members 11, as:

$$h*\tan\theta/(d-t) \quad (1)$$

where d is the interval at which the plate members 11 are aligned, t is the thickness of the plate members 11, and h is the width of the plate members 11.

In this embodiment, the loss of EUV light due to factors associated with an angle that the incident light 12 and the wall surfaces of the plate members 11 make with each other can be 20% or less. That is, the relationship among d, h, t, and θ is given by:

$$h*\tan\theta/(d-t) \leq 0.2 \quad (2)$$

The angle θ takes a value that falls within a range given by:

$$\theta \leq \tan^{-1}\{0.2*(d-t)/h\} \quad (3)$$

In the case of a plasma light source, especially, an LPP which uses a $CO_2$ laser as an excitation laser, the wavelength of infrared light of interest is 10.6 μm. To eliminate infrared light having this wavelength up to a tolerance, the interval d is about 5 μm, the thickness t is about 0.5 μm, and the width h is about 5 μm. Accordingly, as can be seen from inequality (3), the angle θ is about 10° or less.

An angle that the incident light 12 and the normal 13 to the enveloping surface 11c formed by the end surfaces 11b of the plate members 11 make with each other will be described herein with reference to FIG. 2. A distance x from the filter 10, which is required to separate the incident light 12 and the reflected light 15 from each other, is given by:

$$x = a/\tan(2\Phi) \quad (4)$$

where a is the diameter of the collimated incident light 12, and Φ is the angle that the incident light 12 and the normal 13 to the enveloping surface 11c formed by the end surfaces 11b of the plate members 11 make with each other.

In this embodiment, the angle Φ that the incident light 12 and the normal 13 to the enveloping surface 11c formed by the end surfaces 11b of the plate members 11 make with each other is about 20°. When the diameter a of the incident light 12 is 25 mm, the incident light 12 and the reflected infrared light 15 can be separated from each other by placing the filter 10 at a position spaced apart from an optical element on the upstream side by 30 mm or more. The reflected infrared light 15 is absorbed in the absorbing member 16 placed in the exposure apparatus. Since the infrared light 15 absorbed in the absorbing member 16 has a power of several hundred watts, it is desirable to provide a water cooling mechanism for preventing heat radiated by the absorbing member 16.

Second Embodiment

Figure 4A:
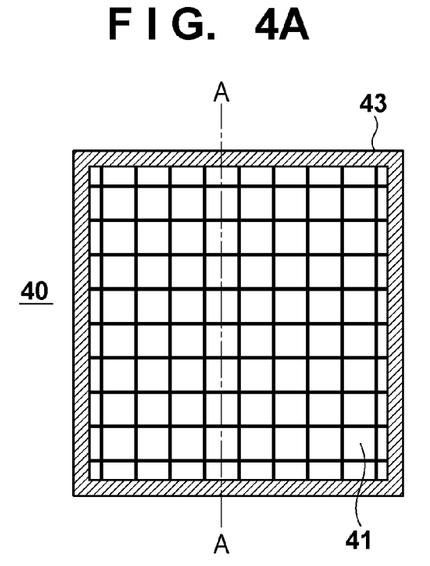
FIGS. 4A and 4B are a front view and sectional view, respectively, of a filter according to the second embodiment.
Figure 4B:
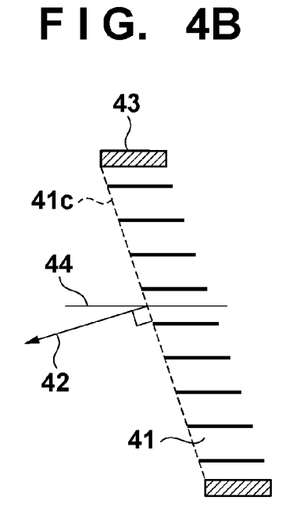

A filter 40 according to the second embodiment will be described with reference to FIGS. 4A and 4B. Only differences from the first embodiment will be described herein. FIGS. 4A and 4B are a front view and sectional view, respectively, of the filter 40 according to the second embodiment. The filter 40 according to the second embodiment has a structure in which a plurality of plate members 41, each of which has a plurality of openings and extends in the direction (second direction) in which the incident light travels, are two-dimensionally positioned so that end surfaces 41c of the members 41, on the side on which light is incident, form a flat surface. The shape of the openings is a square. Since the openings in the filter 40 are two-dimensionally positioned, two polarized components of infrared light can simultaneously be eliminated. The same effect can be obtained when the shape of the openings is a circle or a hexagon as well. An axis 44 of each opening and a normal 42 to the end surface 41c of each member 41 on the side on which light is incident on the filter 40 obliquely intersect with each other. The filter 40 is manufactured by, for example, Si anisotropic etching. The filter 40 is manufactured by Si anisotropic etching, and a metal film for reflecting infrared light is formed on the entire surface of each member 41. The plurality of plate members are supported by a holder 43.

In the exposure apparatus according to the second embodiment, the filter 40 is inserted at the position in the optical path of an illumination system, at which exposure light is collimated, so that the axis 44 of each opening is parallel to incident light. At this time, the normal 42 to the end surface 41c, on the incident side, of each member 41 having an array of openings obliquely intersects with incident light. Of infrared light and EUV light incident on the filter 40 from the upstream side, the filter 40 reflects the infrared light in a direction different from the incident direction, and guides (transmits) the EUV light to an optical system on the downstream side. To prevent the reflected infrared light from becoming stray light and heating the exposure apparatus, an absorbing member 16 for absorbing the reflected infrared light is placed outside the optical path of exposure light. Note that the angle of the normal 42 to the end surface 41c of the filter 40 on the incident side is set so as to bisect an angle determined by a vector formed by the incident light and that which connects the incident point and the absorbing member 16 to each other.

Since the filter 40 used in the exposure apparatus according to the second embodiment has a structure in which openings are arranged in an array pattern, it can simultaneously reflect two polarized components of incident infrared light. Therefore, even if incident infrared light is randomly polarized, only one filter 40 need only be used.

Each member 41 includes openings with a size of about 5 μm, and a plate member with a thickness of about 0.5 μm and a length of about 5 μm. The size of the filter 40 including a plurality of members 41 having these specifications is set to, for example, about 200 mm×100 mm so as to be equal to or larger than the beam size at the position in the exposure apparatus, at which the filter 40 is placed. In the exposure apparatus, the filter 40 is placed so that the axis 44 of each opening and incident light are nearly parallel to each other. The loss of EUV light due to factors associated with an angle that the incident light and the axis 44 of each opening make with each other can be 20% or less, as in the first embodiment. That is, letting θ be the angle that the incident light and the axis 44 of each opening make with each other, the angle θ can take a value which satisfies inequality (3), and is therefore 10° or less. The angle that the axis 44 of each opening and the normal 42 to the end surface 41c of each of the plurality of members 41 on the incident side make with each other can be set to 20°.

Third Embodiment

Figure 5A:
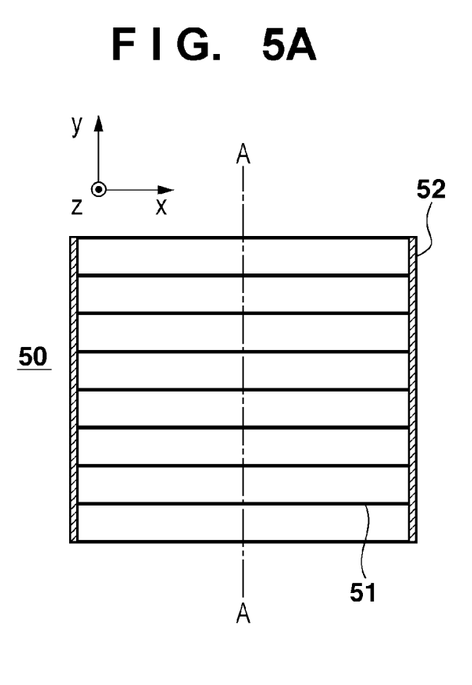
FIGS. 5A and 5B are a front view and sectional view, respectively, of a filter according to the third embodiment.
Figure 5B:
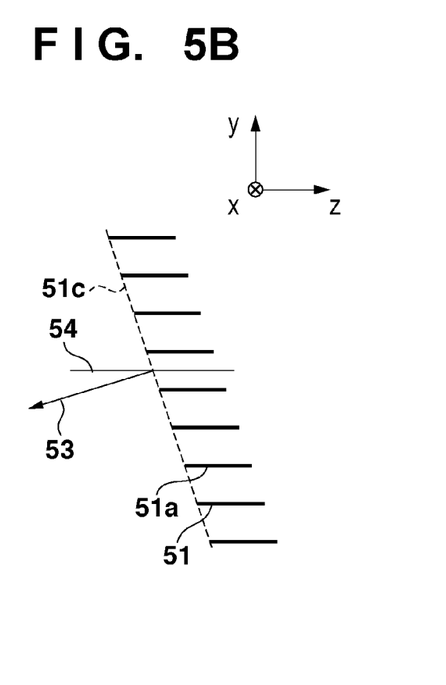

A filter 50 according to the third embodiment will be described with reference to FIGS. 5A and 5B. FIGS. 5A and 5B are a front view and sectional view, respectively, of the filter 50 according to the third embodiment. The filter 50 has a structure in which plate members 51 are arranged in a staircase pattern. The plate members 51 are fixed by bar-shaped supporting members 52. The filter 50 has a shape in which a wall surface 51a of each of the plate members 51 and a normal 53 to an enveloping surface 51c formed by the end surfaces of the plate members 51 obliquely intersect with each other. That is, the filter 50 has a structure in which the plate members 51 are positioned parallel to each other with gaps between them in the y-axis direction (first direction), and the enveloping surface 51c formed by the end surfaces of the plate members 51 is nonparallel to the y-axis (first direction). The plate members 51 are positioned to extend in a second direction (z-axis direction) perpendicular to the first direction. The filter 50 according to the third embodiment is placed so that the wall surfaces 51a of the plate members 51 are parallel to incident light.

The plate members 51 have a width of about 5 μm and a thickness of about 0.5 μm, and are positioned at an interval of about 5 μm. The size of the filter 50 is set to, for example, about 30 mm×30 mm so as to be equal to or larger than the beam size at the position in the exposure apparatus, at which the filter 50 is placed. In the exposure apparatus according to the third embodiment, the filter 50 is placed so that the wall surfaces 51a of the plate members 51 are nearly parallel to incident light. The loss of EUV light due to factors associated with an angle that the incident light and an axis 54 of each opening make with each other can be 20% or less, as in the first embodiment. That is, letting θ be the angle that the incident light and the axis 54 of each opening make with each other, the angle θ can take a value which satisfies inequality (3), and is therefore 10° or less. The angle that the axis 54 of each opening and the normal 53 to the enveloping surface 51c formed by the end surfaces of the plurality of plate members 51 on the incident side make with each other can be set to 20°.

Fourth Embodiment

Figure 6:
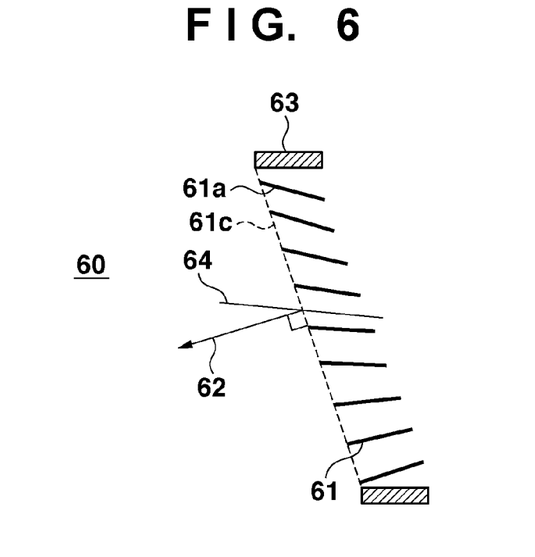
FIG. 6 is a sectional view showing a filter according to the fourth embodiment.

A filter 60 according to the fourth embodiment will be described with reference to FIG. 6. The filter 60 according to the fourth embodiment has a shape in which a plurality of members 61 each having a plurality of openings are positioned so that their first end surfaces 61c form a flat surface and they converge toward the optical path. An axis 64 of each opening of the filter 60 and a normal 62 to the first end surface 61c of each of the plurality of members 61 obliquely intersect with each other, as shown in FIG. 6. The gap between adjacent plate members in their first end surfaces 61c is larger than that between the adjacent plate members on their second end surfaces opposite to their first end surfaces 61c.

Figure 7:
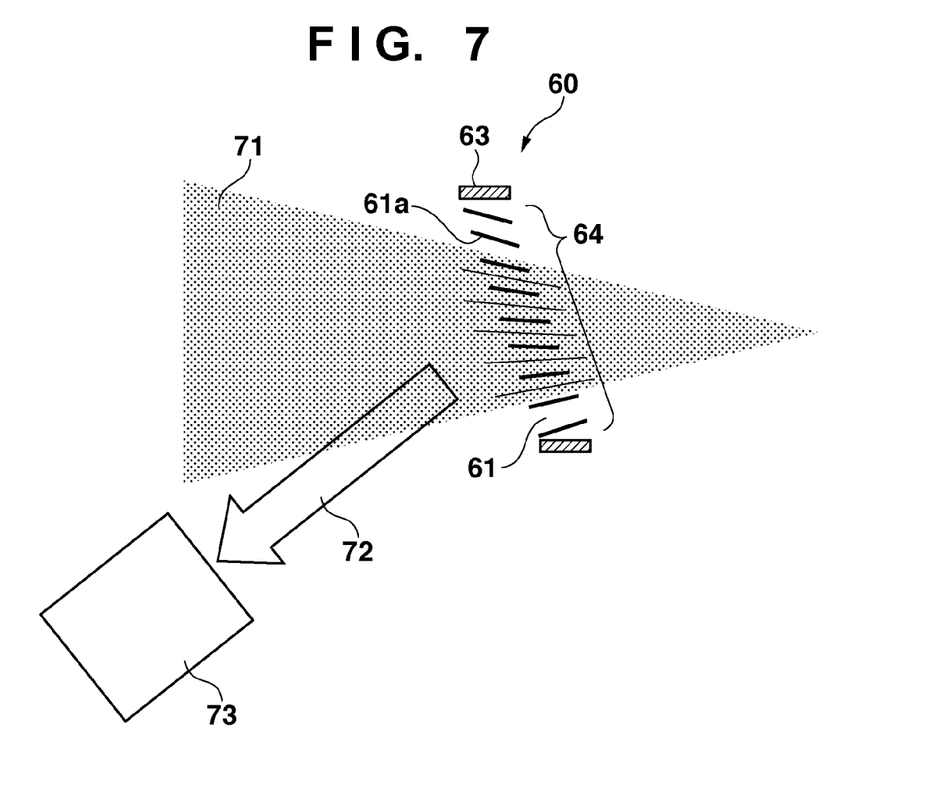
FIG. 7 is a view showing the state in which the filter according to the fourth embodiment reflects infrared light.

The filter 60 is inserted into the optical path of an illumination system, in which incident light 71 is not collimated, as shown in FIG. 7. The incident angle of the incident light 71 on the filter 60 varies in each individual position within the plane of the filter 60, but the axis 64 of each opening is locally parallel to the incident light 71 on the members 61. Hence, since EUV light is not eclipsed by wall surfaces 61a of the members 61, the loss of EUV light minimizes. Infrared light 72 reflected by the filter 60 is absorbed in an absorbing member 73 placed outside the optical path, and therefore does not adversely affect optical elements.

Figure 8:
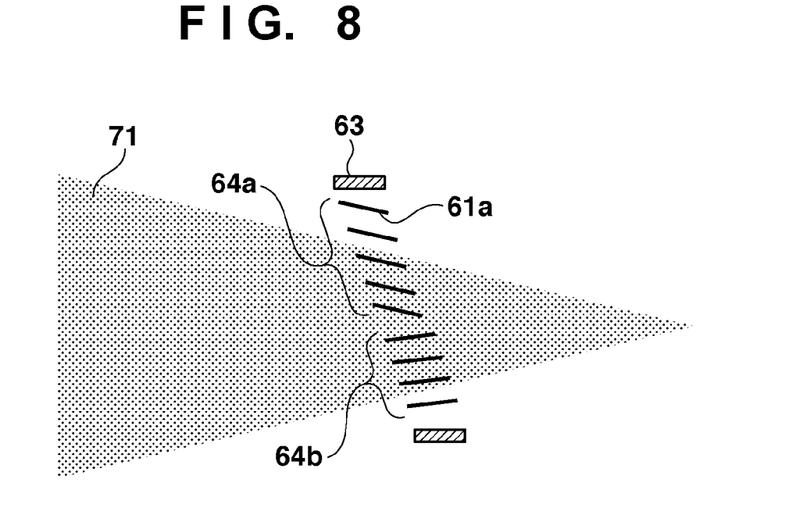
FIG. 8 is a view showing another filter according to the fourth embodiment.

Although the axis 64 of each opening and the incident light 71 on the members 61 are parallel to each other in the fourth embodiment, they need not be parallel to each other at all positions. The axis 64 of each opening may be partly parallel to the incident light 71, as shown in FIG. 8. Using, for example, the angles of two axes 64a and 64b as that of the axis 64 of each opening, EUV light is eclipsed by the wall surfaces 61a of the members 61 at the position at which the axis 64 of each aperture and the incident light 71 are nonparallel to each other, so the transmittance of EUV light decreases, but the filter 60 can more easily be manufactured. That is, the gap between at least one set of adjacent plate members in their first end surfaces need only be larger than that between these plate members in their second end surfaces. The upper limit of the angle that the incident light 71 and the axis 64 of each opening make with each other is determined from the projection area of the members 61 in the same manner as in the first embodiment, and is, for example, 10°. Since a member having the axis 64a and that having the axis 64b can be independently manufactured and integrated in a holder 63, the filter 60 can more easily be manufactured.

Fifth Embodiment

A filter according to the fifth embodiment will be described. In the fifth embodiment, members 61 shown in FIG. 6 are formed by a plurality of plate members, and a filter 60 has a structure in which the plate members 61 are arranged in a staircase pattern. A wall surfaces 61a of each of the plate members 61 of the filter 60 and a normal 62 to an enveloping surface 61c formed by the end surfaces of the plate members 61 obliquely intersect with each other, and the angle that the wall surface 61a and the normal 62 make with each other varies in each individual position.

Sixth Embodiment

Figure 9A:
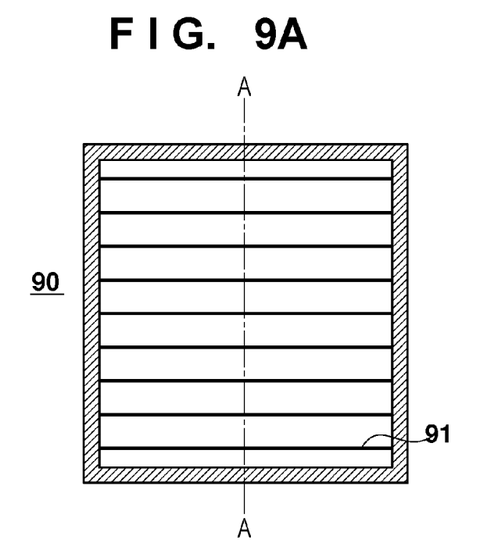
FIGS. 9A and 9B are a front view and sectional view, respectively, of a filter according to the sixth embodiment.
Figure 9B:
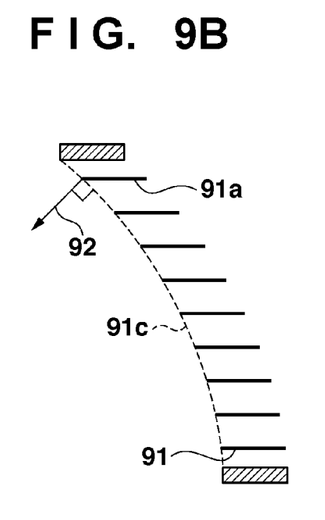
Figure 10:
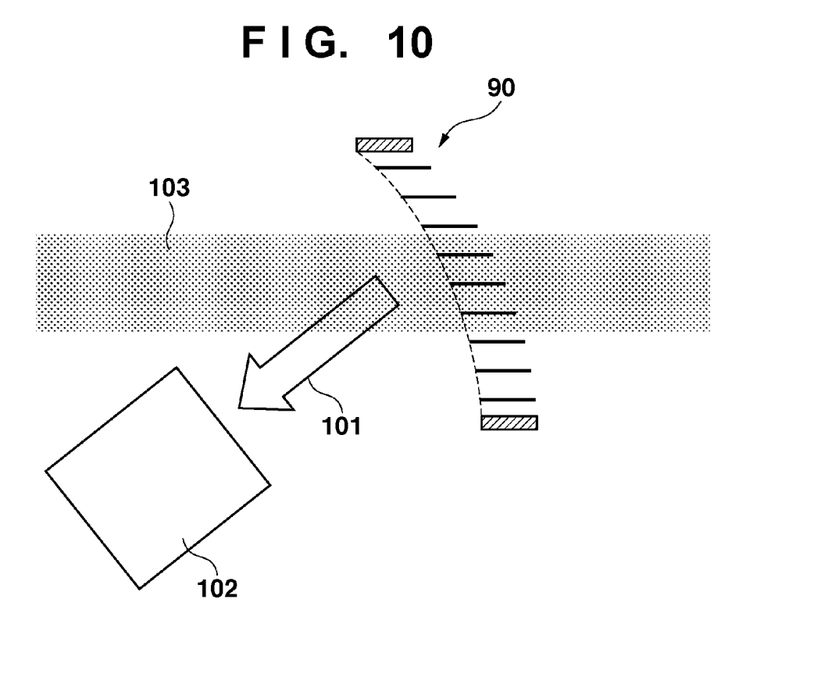
FIG. 10 is a view showing the state in which the filter according to the sixth embodiment reflects infrared light.

A filter 90 according to the sixth embodiment will be described with reference to FIGS. 9A and 9B. As shown in FIG. 9B, end surfaces 91c of plate members 91 of the filter 90 form a curved surface, and the position of the center of curvature of this curved surface in a first direction falls outside the range, in the first direction, of one region including all of a plurality of openings. That is, normals 92 to the end surfaces 91c, and inner walls 91a of the filter 90 obliquely intersect with each other at all positions. The filter 90 is inserted into the optical path of an illumination system, in which incident light 103 is collimated, as shown in FIG. 10. Reflected infrared light 101 is converged by the filter 90, and absorbed in an absorbing member 102. Since the reflected infrared light 101 is converged, the absorbing member 102 can be downsized. Downsizing the absorbing member 102 improves the freedom of placement in the illumination system, thus making it easier to design the illumination system. Note that in place of the plurality of plate members 91 according to the sixth embodiment, a plurality of bar-shaped members may be positioned so that a plurality of openings are present only on one end surface of each plate member 91.

Seventh Embodiment

Figure 11A:
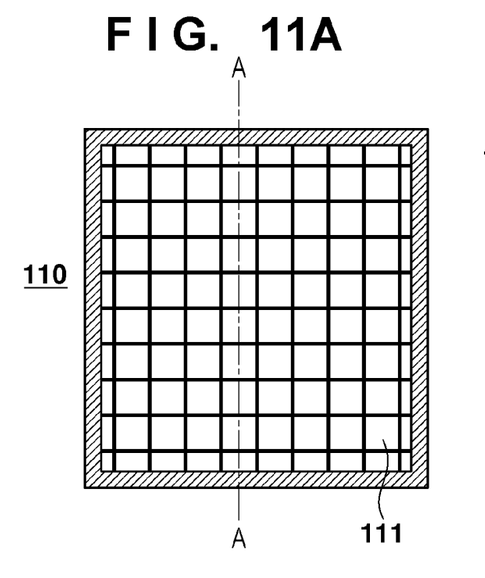
FIGS. 11A and 11B are a front view and sectional view, respectively, of a filter according to the seventh embodiment.
Figure 11B:
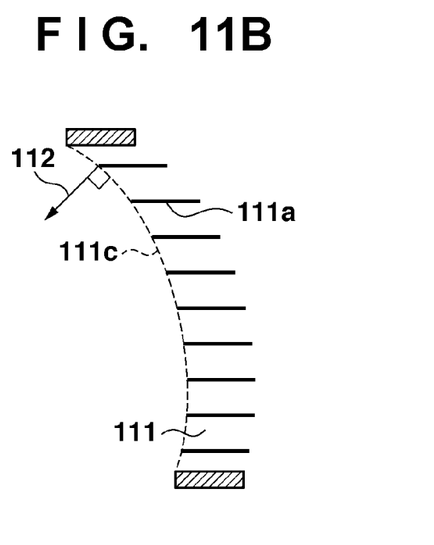

A filter 110 according to the seventh embodiment will be described with reference to FIGS. 11A and 11B. As shown in FIG. 11B, an end surface 111c of a member 111 having a plurality of two-dimensionally arranged openings has a given curvature, and normals 112 to the end surface 111c and inner walls 111a of the filter 110 obliquely intersect with each other at all positions.

Eighth Embodiment

Figure 12A:
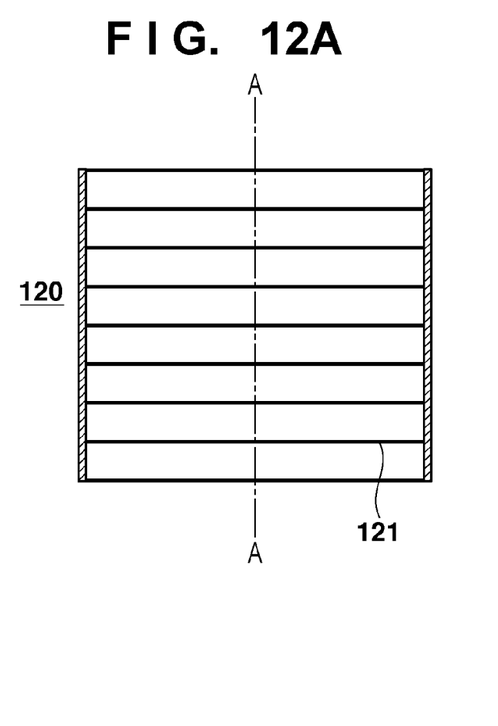
FIGS. 12A and 12B are a front view and sectional view, respectively, of a filter according to the eighth embodiment.
Figure 12B:
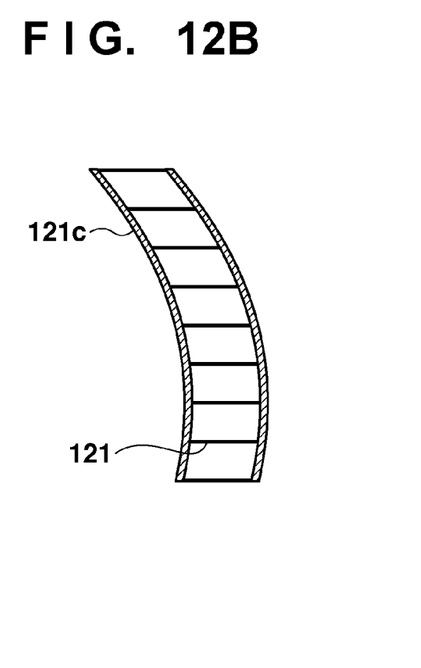

A filter 120 according to the eighth embodiment will be described with reference to FIGS. 12A and 12B. The plurality of plate members are fixed on the holder in the sixth embodiment, whereas they are fixed by bar-shaped supporting members in the eighth embodiment. As shown in FIG. 12B, an enveloping surface 121c formed by the end surface of each plate member of the filter 120 has a given curvature, and normals to the enveloping surface 121c and the inner walls of the filter 120 obliquely intersect with each other at all positions.

Method of Manufacturing Device

A method of manufacturing a device (for example, a semiconductor device or a liquid crystal display device) will be described next. A semiconductor device is manufactured by a preprocess of forming an integrated circuit on a wafer (substrate), and a post-process of completing, as a product, a chip of the integrated circuit formed on the wafer by the preprocess. The preprocess includes a step of exposing a wafer, coated with a photosensitive agent, using the above-mentioned exposure apparatus, and a step of developing the wafer exposed in the exposing step. The post-process includes an assembly step (dicing and bonding) and packaging step (encapsulation). A liquid crystal display device is manufactured by a step of forming a transparent electrode. The step of forming a transparent electrode includes a step of coating a photosensitive agent on a glass substrate on which a transparent conductive film is deposited, a step of exposing the glass substrate, coated with the photosensitive agent, using the above-mentioned exposure apparatus, and a step of developing the glass substrate. The method of manufacturing a device according to this embodiment can manufacture a device with a quality higher than those of devices manufactured by the prior arts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-000006 filed Jan. 1, 2011, which is hereby incorporated by reference herein in its entirety.

What is claimed is:

1. An exposure apparatus for exposing a substrate to light, the apparatus comprising:
a light source that emits light containing a first light having a first wavelength, and a second light having a second wavelength shorter than the first wavelength; and
a filter that reflects the first light of the light emitted by the light source, and transmits the second light of the light emitted by the light source,
wherein the filter includes a plurality of plate members having a plurality of openings,
wherein the plurality of plate members are arranged one-dimensionally or two-dimensionally,
wherein wall surfaces of the plurality of plate members are parallel to a direction to which the second light is transmitted,
wherein an end surface, on a side on which light is incident, formed by the plurality of plate members is nonparallel to a plane perpendicular to a direction to which the second light is transmitted, and
wherein the substrate is exposed to the second light transmitted through the filter.

2. The exposure apparatus according to claim 1, wherein:
the plurality of plate members are positioned with gaps therebetween in a first direction, and
the gap between at least one set of adjacent plate members, among the plurality of plate members, in first end surfaces is larger than the gap between the at least one set of adjacent plate members in second end surfaces thereof opposite to the first end surfaces.

3. The exposure apparatus according to claim 1, wherein the first light is infrared light, and the second light is extreme ultra-violet (EUV) light.

4. An exposure apparatus for exposing a substrate to light, the apparatus comprising:
a light source that emits light containing a first light having a first wavelength, and a second light having a second wavelength shorter than the first wavelength; and
a filter that reflects the first light of the light emitted by the light source, and transmits the second light of the light emitted by the light source,
wherein the filter includes a member that includes a plurality of openings,
wherein wall surfaces that form the plurality of openings included in the member are parallel to a direction to which the second light is transmitted,
wherein an end surface, on a side on which light is incident, of the member is nonparallel to a plane perpendicular to a direction to which the second light is transmitted, and
wherein the substrate is exposed to the second light transmitted through the filter.

5. The exposure apparatus according to claim 4, wherein:
at least one opening among the plurality of openings is larger in a first end surface of the member than in a second end surface of the member, which is opposite to the first end surface.

6. The exposure apparatus according to claim 4, wherein the first light is infrared light, and the second light is extreme ultra-violet (EUV) light.

7. An exposure apparatus for exposing a substrate to light, the apparatus comprising:
a light source that emits light containing a first light having a first wavelength, and a second light having a second wavelength shorter than the first wavelength; and
a filter that reflects, the first light of the light emitted by the light source, and transmits the second light of the light emitted by the light source,
wherein an end surface includes a plurality of openings arranged in at least a first direction,
wherein the end surface forms a curved surface, and a position of the center of curvature of the curved surface in the first direction falls outside a range, in the first direction, of one region including all of the plurality of openings, and
wherein the substrate is exposed to the second light transmitted through the filter.

8. The exposure apparatus according to claim 7, wherein the first light is infrared light, and the second light is extreme ultra-violet (EUV) light.

9. A method of manufacturing a device, the method comprising:
exposing a substrate to light using an exposure apparatus;
developing the exposed substrate; and processing the developed substrate to manufacture the device, wherein the exposure apparatus comprises:

a light source that emits light containing a first light having a first wavelength, and a second light having a second wavelength shorter than the first wavelength; and a filter that reflects the first light of the light emitted by the light source, and transmits the second light of the light emitted by the light source, wherein the filter includes a plurality of plate members having a plurality openings, wherein the plurality of plate members are arranged one-dimensionally or two-dimensionally, wherein wall surfaces of the plurality of plate members are parallel to a direction to which the second light is transmitted, wherein an end surface, on a side on which light is incident, formed by the plurality of plate members is nonparallel to a plane perpendicular to a direction to which the second light is transmitted, and wherein the substrate is exposed to the second light transmitted through the filter.

10. A method of manufacturing a device, the method comprising:

exposing a substrate to light using an exposure apparatus;

developing the exposed substrate; and processing the developed substrate to manufacture the device, wherein the exposure apparatus comprises:

a light source that emits light containing a first light having a first wavelength, and a second light having a second wavelength shorter than the first wavelength; and a filter that reflects the first light of the light emitted by the light source, and transmits the second light of the light emitted by the light source, wherein the filter includes a member that includes a plurality of openings, wherein wall surfaces that form the plurality of openings included in the member are parallel to a direction to which the second light is transmitted, wherein an end surface, on a side on which light is incident, of the member is nonparallel to a plane perpendicular to a direction to which the second light is transmitted, and wherein the substrate is exposed to the second light transmitted through the filter.

11. An exposure apparatus for exposing a substrate to light, the apparatus comprising:

a light source that emits light containing a first light having a first wavelength, and a second light having a second wavelength shorter than the first wavelength; and a first filter and a second filter that reflect the first light of the light emitted by the light source, and transmits the second light of the light emitted by the light source, wherein the first filter includes a plurality of first plate members having a plurality of openings, wherein the plurality of first plate members are arranged one-dimensionally, wherein wall surfaces of the plurality of first plate members are parallel to a direction to which the second light is transmitted, wherein an end surface, on a side on which light is incident, formed by the plurality of first plate members is inclined to a plane perpendicular to a direction to which the second light is transmitted, wherein the second filter includes a plurality of second plate members having a plurality of openings, wherein the plurality of second plate members are arranged one-dimensionally in a direction perpendicular to a direction in which the plurality of first plate members are arranged one-dimensionally, wherein wall surfaces of the plurality of second plate members are parallel to a direction to which the second light is transmitted, wherein an end surface, on a side on which light is incident, formed by the plurality of second plate members, is inclined to a plane perpendicular to a direction to which the second light is transmitted, wherein light transmitted through the first filter is incident on the second filter, and wherein the substrate is exposed to the second light transmitted through the second filter.

12. The exposure apparatus according to claim 11, wherein the end surface, on a side on which light is incident, formed by the plurality of first plate members, is a flat surface.

13. The exposure apparatus according to claim 11, wherein the end surface, on a side on which light is incident, formed by the plurality of first plate members, is a curved surface.

14. The exposure apparatus according to claim 11, wherein the first light is infrared light, and the second light is extreme ultra-violet (EUV) light.

* * * * *